United States Patent [19]

Kitoh et al.

[11] Patent Number: 5,275,850
[45] Date of Patent: Jan. 4, 1994

[54] PROCESS FOR PRODUCING A MAGNETIC DISK HAVING A METAL CONTAINING HARD CARBON COATING BY PLASMA CHEMICAL VAPOR DEPOSITION UNDER A NEGATIVE SELF BIAS

[75] Inventors: Makoto Kitoh; Yuichi Kokaku; Makiko Itoh, all of Yokohama, Japan

[73] Assignee: Hitachi, Ltd., Tokyo, Japan

[21] Appl. No.: 755,589

[22] Filed: Sep. 4, 1991

Related U.S. Application Data

[63] Continuation of Ser. No. 339,642, Apr. 18, 1989, abandoned.

[30] Foreign Application Priority Data

Apr. 20, 1988 [JP] Japan .................... 63-95509
May 13, 1988 [JP] Japan .................... 63-114728

[51] Int. Cl.$^5$ .................... G11B 05/00; C23C 16/00
[52] U.S. Cl. .................... 427/577; 428/408; 428/694; 428/900; 427/126.1; 427/130; 427/131; 427/249; 427/255.2; 427/122
[58] Field of Search .................... 428/694, 900, 336, 408; 427/130, 122, 126.1, 37, 131, 249, 255.2, 577; 204/192.15, 192.16

[56] References Cited

U.S. PATENT DOCUMENTS

| | | | |
|---|---|---|---|
| 4,647,494 | 3/1987 | Meyerson et al. | 428/216 |
| 4,717,622 | 1/1988 | Kurokawa et al. | 428/408 |
| 4,778,582 | 10/1988 | Howard | 204/192.15 |
| 4,833,031 | 5/1989 | Kurokawa et al. | 428/336 |
| 4,869,923 | 9/1989 | Yamazaki | 427/38 |
| 4,877,677 | 10/1989 | Hirochi et al. | 428/216 |
| 4,915,977 | 4/1990 | Okamoto et al. | 427/37 |
| 4,932,331 | 6/1990 | Kurihara et al. | 106/286.1 |
| 4,935,303 | 6/1990 | Ikoma et al. | 428/408 |
| 5,073,241 | 12/1991 | Watanabe | 204/192.15 |

FOREIGN PATENT DOCUMENTS

| | | |
|---|---|---|
| 60-28053 | 7/1985 | Japan . |
| 62-40375 | 2/1987 | Japan . |
| 62-214174 | 2/1987 | Japan . |
| 62-235393 | 10/1987 | Japan . |
| 63-31020 | 2/1988 | Japan . |
| 63-79230 | 4/1988 | Japan . |
| 63-286334 | 11/1988 | Japan . |

OTHER PUBLICATIONS

IEEE Transactions on Magnetics, vol. MAG-17, No. 4, Jul., 1981 pp. 1376-1379.
Thin Solid Films, 80(1981) 227-234 "Metallurgical and Protective Coatings".

Primary Examiner—Stevan A. Resan
Attorney, Agent, or Firm—Kenyon & Kenyon

[57] ABSTRACT

A magnetic disk comprising a nonmagnetic substrate, a metallic thin film magnetic layer provided on the substrate and a hard carbon protective layer provided on the magnetic layer, the hard carbon protective layer containing at least one metal element of silicon, germanium, tin and lead, or further containing fluorine, formed by bias plasma CVD treatment, has a high attrition resistance, a high peeling resistance and a high crack resistance or further a higher corrosion resistance.

2 Claims, 1 Drawing Sheet

PROCESS FOR PRODUCING A MAGNETIC DISK HAVING A METAL CONTAINING HARD CARBON COATING BY PLASMA CHEMICAL VAPOR DEPOSITION UNDER A NEGATIVE SELF BIAS

This application is a continuation of application Ser. No. 07/339,642, filed Apr. 18, 1989, now abandoned.

BCKGROUND OF THE INVENTION

The present invention relates to a magnetic disk and a process for producing the same, and particularly to a magnetic disk having a hard carbon film as a protective layer, suitable for a thin film magnetic disk and a process for producing the same.

Generally, recording and reproduction by a magnetic recording apparatus comprising a recording-reproducing magnetic head, (which will be hereinafter referred to as "a head") and a magnetic recording medium, are carried out in the following manner. Before the start of operation, the head and the surface of the magnetic recording medium are brought into contact with one another. Then, the magnetic recording medium is rotated, whereby an air layer gap is formed between the head and the surface of the magnetic recording medium. Recording and reproduction are carried out in that state. This system of recording and reproduction is called a "contact-start-stop system" which will be hereinafter referred to as a "CSS". In a CSS, the head and the surface of the magnetic recording medium are in a mutual contact friction state at the start of rotation of the magnetic recording medium and/or at the stop of rotation of medium. The contact friction force developed between the head and the surface of the magnetic recording medium in the contact friction state wears the head and the magnetic recording medium, ultimately damaging to the head and the magnetic recording medium and leading to a condition called head crush. Furthermore, a slight change in the position of the head in the contact friction state makes a load upon the head uneven, and the head and the surface of the magnetic recording medium are sometimes damaged by that condition.

In order to prevent such damage, it has been proposed to form a sputter film as a protective layer by sputtering graphite onto the magnetic layer or to form a hard carbon film by plasma injection CVD, which will be hereinafter referred to as "PI-CVD". Carbon protective films of this type are disclosed, for example, in IEEE Transaction on Magnetics, Vol. MAG-17, No. 4, pp 1376-1379, July (1981): "Data point thin film media" and U.S. Pat. No. 4,647,495.

When the magnetic layer is a metallic medium such as Co—Ni, Co—Ni—Cr, Co—Ni—P, etc., corrosion occurs under a high humidity condition. In order to prevent such corrosion it has been proposed to form a polysilicate film on the magnetic layer (Japanese Patent Publication No. 60-28053).

The carbon film formed by PI-CVD is hard, for example, a Vickers hardness of 2,000 to 3,000 kg/mm$^2$, and thus has a higher attrition resistance than that of graphite sputter film. In order to assure a satisfactory durability as a magnetic disk, the carbon film must have a thickness of about 500 Å. However, a thinner film is preferable for a higher recording density. In order to obtain a satisfactory attrition resistant durability even if the film thickness is small, it is necessary to make the carbon film harder. However, the carbon film is liable to peel off from the magnetic layer due to an internal strain developed if the carbon film is made harder, or the impact strength is lowered. Thus, cracks are often formed when the head is brought into contact with the disk. These problems must be overcome. To this end, it has been proposed to provide an intermediate layer of Si, Cr, Ti, Zr, Hf, V, Nb, Ta, Cr, Mo, W or the like, which can form a strong bond to carbon, between the magnetic layer and the carbon film. However, introduction of the intermediate layer requires one more step in the film-forming process, resulting in a higher production cost and also results in a decrease in the recording density due to a longer distance from the magnetic layer to the head. That is, it is a current task to develop a carbon protective film having a higher attrition resistance, a higher crack resistance and a stronger bond to the magnetic layer, even if the thickness of the carbon protective layer is small.

Furthermore, it has been proposed to provide a fluorine or carbon fluoride-containing amorphous carbon film as a protective film in a magnetic disk by sputtering or plasma CVD to give a lubricating property and an attrition resistance to the disk [Japanese Patent Application Kokai (Laid-open) Nos. 63-31020, 62-214174, 62-40375 and 63-79230]. However, no satisfactory attrition resistance and corrosion resistance have been obtained yet in the prior art.

SUMMARY OF THE INVENTION

The present invention provides a magnetic disk comprising an improved carbon protective film free from the foregoing problems and also provides a process for producing such a magnetic disk.

The present invention further provides a magnetic disk comprising a hard carbon protective film having a high corrosion resistance and a process for producing that magnetic disk.

According to the present invention a magnetic disk can comprise a non-magnetic substrate, a metallic thin film magnetic layer provided on the non-magnetic substrate and a hard carbon protective film provided on the metallic thin film magnetic layer, the hard carbon protective layer containing at least one metal element selected from the group consisting of silicon; germanium, tin and lead.

The metal element contained in the present hard carbon protective film is preferably distributed uniformly in the carbon film, and its content is usually not more than 20% by atom, preferably 1 to 15% by atom, more preferably 3 to 10% by atom. That is, the metal element as contained contributes to an increase in the peeling resistance and the crack resistance, and even a small amount of the metal element as contained has an effect corresponding thereto. However, too much metal element will lower the hardness and attrition resistance of the carbon protective film. Thus, the content of metal in the above mentioned ranges is desirable. The thickness of the carbon film is usually not more than 500 Å, practically 200 to 300 Å. Furthermore, the hard carbon protective layer is amorphous and has a Vickers hardness of preferably at least 1,500 and more preferably 2,000 to 6,000.

Any of the above-mentioned metal elements as contained has a desirable effect upon an increase in the strength of the carbon film and upon a higher bonding to a magnetic layer as a sublayer. Silicon is particularly preferable.

As a nonmagnetic substrate, metals such as aluminum alloy, stainless steel, titanium alloy, etc., ceramics such as silicon nitride, silicon carbide, etc., glass, and plastics such as polyester, polyimide, etc. can be used.

As the metallic thin film magnetic layer to be provided on the non-magnetic substrate, any of well known ferromagnetic layers of, for example, Co—Ni, Co—Ni—P, Co—Ni—Cr, Co—Pt, Co—Ni—Pt, Co—Ni—Mo, Co—V, etc. can be used.

Furthermore, a liquid lubricant, for example, perfluoroalkyl-based lubricants, can be provided on the hard carbon protective film as a lubricant layer.

In the present magnetic disk, a hard carbon protective film containing at least one metal element selected from the group consisting of silicon, germanium, tin and lead is formed on a magnetic metal layer on a nonmagnetic substrate by placing the nonmagnetic substrate, on which a magnetic metal layer is formed, on a high frequency wave electrode in a high frequency wave plasma chamber, evacuating the chamber to a high vacuum, then feeding a saturated hydrocarbon compound and at least one of hydrides, alkyl compounds and alkoxy compounds of at least one metal element selected from the group consisting of silicon, germanium, tin and lead separately, or in a mixture, into the chamber, and conducting a bias plasma CVD treatment under a gas pressure of 1 to 500 m Torr.

The bias plasma CVD treatment usually means a treatment with plasma CVD obtained by applying an AC voltage of high frequency wave, low frequency wave, etc. to a substrate with a voltage drop of 100 to 3 KV toward the substrate, thereby producing a self-bias. The discharge is stable even if an insulating carbon film is formed on the electrode particularly in a high frequency discharge, and thus is suitable for forming the present hard carbon protective film. In other words, it is difficult to form the present hard carbon protective film by ordinary vacuum evaporation, sputtering, CVD without bias, etc. Thus, the bias plasma CVD treatment is a very important means in the present process for producing a magnetic disk.

Raw material gas components for carbon and metal elements for use in the formation of a hard carbon protective film will be explained in detail below.

(1) Saturated hydrocarbon gases such as methane $CH_4$, ethane $C_2H_6$, propane $C_3H_8$, butane $C_4H_{10}$, etc. can be used as the carbon component, and (2) At least one of the hydrides, alkyl compounds or alkoxy compounds, of either Si, Ge, Sn or Pb can be used as the metal element component.

The hydrides, alkyl compounds and alkoxy compounds will be explained in detail below, referring to Si as typical of the metal elements.

Hydrides include, for example, monosilane $SiH_4$, disilane $Si_2H_6$, etc. Alkyl compounds include, for example, silicon compounds represented by the general formula $SiR_4$ and alkoxy compounds include, for example, silicon compounds represented by the general formula $Si(OR)_4$, where R is an alkyl group such as methyl $CH_3$, ethyl $C_2H_5$, propyl $C_3H_7$, butyl $C_4H_9$, etc. As to other metal elements, i.e. Ge, Sn and Pb compounds almost similar to Si compounds can be used.

A hard carbon protective film containing at least one of the metal elements can be readily formed on the magnetic layer by feeding at least one of the raw material carbon component gases and at least one of raw material metal element component gases into a high frequency plasma chamber and carrying out a bias plasma CVD treatment under a gas pressure of 1 to 500 m Torr, preferably 10 to 200 m Torr with a discharge voltage of 20 to 2,000 W, preferably 50 to 1,000 W.

An atomic ratio of carbon to metal element in the raw material carbon component gas and the raw material metal element component gas depends upon the gas species to be used, that is, combinations of gas species to be used, for example, $CH_4$—$SiH_4$, $C_2H_6$—$SiH_4$, $CH_4$—$Si(CH_3)_4$, $C_3H_8$—$Si(CH_3)_4$, etc. An atomic ratio of the carbon to the metal element in the hard carbon protective film is substantially proportional to an atomic ratio of the carbon to the metal element in the raw material carbon component gas and the raw material metal element component gas to be fed to the high frequency plasma chamber. Thus, the flow rates of the raw material carbon component gas and the raw material metal element component gas must be adjusted to a flow rate ratio that meets the atomic ratio of the carbon to the metal element in a desired hard carbon protective film. That is, the flow rate ratio must be set to make an atomic ratio of the metal element to the carbon of not more than 20%, preferably 1 to 15%, and more preferably 3 to 10%.

A second embodiment of the present invention can be attained by adding fluorine to the foregoing hard carbon protective film of the present invention, where the hard carbon protective film may sometimes take the form of a carbon fluoride film containing at least one of the metal elements.

The higher an atomic ratio of fluorine to carbon in the fluorine-containing hard carbon protective film containing at least one of the metal elements, the more improved the corrosion resistance. However, high a fluorine content lowers the hardness and the attrition resistance. Thus, the atomic ratio of fluorine to carbon must be 1:1 at maximum. The fluorine-containing hard carbon protective film can be formed by feeding a carbon fluoride gas such as $CF_4$, $CH_3F$, $CHF_3$, $C_2F_6$, $C_2H_4F_2$, $C_3F_6$, $C_3H_2F_6$, $C_4F_8$, $C_4F_8$, $C_4F_{10}$, etc. separately or in a mixture thereof with the raw material carbon component gas such as $CH_4$$C_2H_6$, $C_3H_8$, $C_4H_{10}$, etc. to a high frequency plasma chamber and carrying out the bias plasma CVD treatment under the same conditions as mentioned above.

The present hard carbon protective film containing at least one of Si, Ge, Sn and Pb has a high hardness and distinguished peeling resistance and crack resistance, as will be specifically given in Examples which follow, and it seems that the internal strains are reduced by the metal element as contained, and strong bonding is formed among the metal elements as contained, the magnetic layer and the carbon, whereby the peeling resistance and crack resistance are improved.

The corrosion resistance of the hard carbon protective film can be improved by adding fluorine to the present hard carbon protective film, as will be specifically given in Examples which follow, and it seems that the fluorine-containing hard carbon protective layer is water-repellent and has a low surface energy, as compared with the hard carbon protective layer containing no fluorine, and thus can prevent permeation of moisture in a high humidity state, thereby improving the corrosion resistance.

DETAILED DESCRIPTION

Example 1

Figure 1:
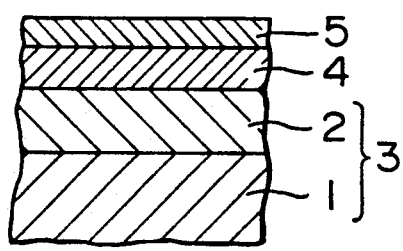
FIG. 1 is a cross-sectional view of a magnetic disk according to one embodiment of the present invention.

One embodiment of the present invention will be described in detail below, referring to the drawings.

A cross-sectional view of a magnetic disk according to one embodiment of the present invention is shown in FIG. 1, where numeral 1 is a nonmagnetic substrate of aluminum alloy; 2 is a Co—Ni alloy magnetic layer formed on the nonmagnetic substrate 1 using an Ni—P plating film formed on the substrate as an underlayer (not shown in the drawing); 3 is the so called magnetic disk base; 4 is a Si-containing hard carbon protective film characteristic of the present invention; and 5 is a lubricant layer.

Figure 2:
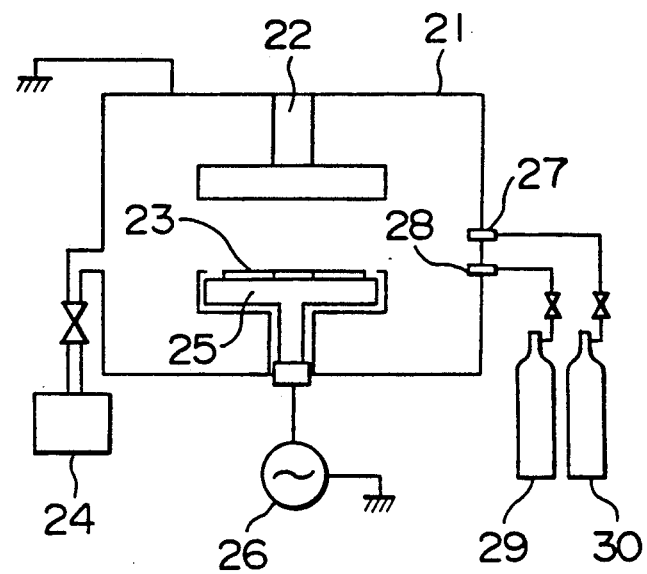
FIG. 2 is a schematic view of an apparatus for carrying out the present invention.

FIG. 2 is a schematic view of a bias plasma CVD apparatus for producing the magnetic disk shown in FIG. 1.

A process for producing the magnetic disk of FIG. 1 in the CVD apparatus of FIG. 2 will be described below.

A disk base 3 (23 in FIG. 2), prepared by coating an aluminum alloy substrate 1 with a Ni—P plating film, finishing the surface to a surface roughness of 0.005 μm and forming a Co—Ni alloy as a magnetic layer 2 serving as a magnetic recording-reproducing medium to a thickness of 0.06 μm by sputtering, was placed on a high frequency electrode 25 connected to a high frequency power source 26 and provided in a vacuum chamber 21 which constituted a bias plasma CVD treatment chamber of FIG. 2. Then, ground electrode 22 was provided in parallel to the high frequency electrode 25. Then, a vacuum pump 24 was actuated, and a methane $CH_4$ gas 29 was introduced as a raw material carbon component gas into the vacuum chamber 21 through a gas inlet 28 and monosilane $SiH_4$ gas 30 as a raw material Si gas into the vacuum chamber 21 through a gas inlet 27. Then, a voltage of 500–1,000 V at a high frequency of 13.56 MHz was applied between the high frequency electrode 25 and the ground electrode 22 to generate a plasma between the electrodes. Then, the mixed gas pressure was set to an appropriate pressure, ranging from 1 to 500 m Torr, and the discharge power was set to an appropriate power, ranging from 20 to 2,000 W, and a Si-containing hard carbon protective film 4 was formed to a thickness of 0.025 μm onto the disk base 3.

In that case, it is known that a negative bias voltage, that is, a self-bias, is automatically established on the high frequency electrode side (for example, Brian N. Chapman: Glow discharge process, page 143). By the negative bias of 300 to 600 V, carbon ions and silicon ions were accelerated to form a film, and thus a hard carbon film containing silicon was obtained.

Figure 3:
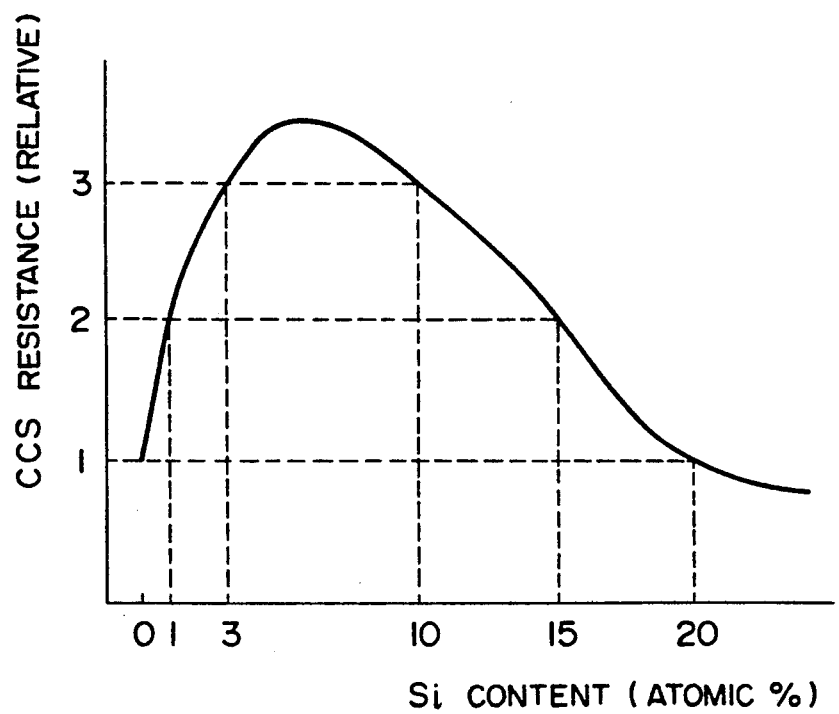
FIG. 3 is a characteristic diagram showing a relationship between the silicon content of a hard carbon protective film according to one embodiment of the present invention and the CSS resistance.

By changing the flow rates of methane $CH_4$ gas 29 and monosilane $SiH_4$ gas 30 through the gas inlet 28 and the gas inlet 27, respectively, Si-containing hard carbon protective films having different atomic ratios of Si to C in the film were prepared and their CSS resistance was evaluated. The results are shown as a characteristic curve in FIG. 3, from which it is apparent that the effect is significant at an atomic ratio of Si to C of not more than 20%; an effect at least twice that without Si can be obtained at an atomic ratio of Si to C of 1 to 15%; and an effect at least three times that without Si can be obtained at an atomic ratio of Si to C of 3 to 10%.

Example 2

A gas mixture consisting of 60 parts by volume of methane $CH_4$ gas as a raw material carbon component gas and 8 parts by volume of tetramethylsilane $Si(CH_3)_4$ gas as a raw material Si component gas was used in the same bias plasma CVD treatment under a mixed gas pressure of 10 m Torr in the same manner as in Example 1 to form a Si-containing hard carbon protective film. The results are shown in Table 1. A very good CSS characteristic was obtained.

Example 3

A gas mixture consisting of 92 parts by volume of $CH_4$ gas and 8 parts by volume of $GeH_2$ gas was used in the same bias plasma CVD treatment under a mixed gas pressure of 10 mTorr in the same manner as in Example 1 to form a Ge-containing hard carbon protective film. The results are shown in Table 1. A very good CSS characteristic similar to that of Example 2 was obtained.

Example 4

A gas mixture consisting of 92 parts by volume of $CH_4$ gas and 8 parts by volume of $SnH_4$ gas was used in the same bias plasma CVD treatment under a mixed gas pressure of 10 m Torr in the same manner as in Example 3 to form a Sn-containing hard protective film. The results are shown in Table 1. A very good CSS characteristic similar to that of Example 2 was obtained.

Example 5

A gas mixture consisting of 92 parts by volume of a methane $CH_4$ gas and 9 parts by volume of a lead tetrahydride $PbH_4$ gas was used in the same bias plasma CVD treatment under a mixed gas pressure of 10 m Torr in the same manner as in Example 3 to form a Pb-containing hard carbon protective film. The results are shown in Table 1. A very good CSS characteristic similar to that of Example 2 was obtained.

Example 6

4 parts by volume of the 9 parts by volume of the $Si(CH_3)_4$ gas of Example 2 was replaced with 2 parts by volume of $GeH_4$ and 2 parts by volume of $SnH_4$ and the same bias plasma CVD treatment was carried out in the same manner as in Example 2 to form a Si, Ge and Sn-containing hard carbon protective film. The results are shown in Table 1. A CSS characteristic similar to that of Example 2 was obtained.

Example 7

4 parts by volume of the 8 parts by volume of $GeH_4$ gas of Example 3 was replaced with 2 parts by volume of $SnH_4$ and 2 parts by volume of $PbH_4$ and the bias plasma CVD treatment was carried out in the same manner as in Example 3 to form a Ge, Sn and Pb-containing hard carbon protective film. The results are shown in Table 1. A similar CSS characteristic similar to that of Example 3 was obtained.

Comparative Example 1

Bias plasma CVD treatment was carried out only with $CH_4$ gas under a gas pressure of 10 m Torr in the same manner as in Example 2 without using any raw material metal element component gas to form a hard carbon protective film consisting only of the carbon component. The results are shown in Table 1. The CSS characteristic was considerably poor.

Comparative Example 2

A gas mixture consisting of 60 parts by volume of $CH_4$ gas and 40 parts by volume of $SiH_4$ gas in place of 8 parts by volume of $Si(CH_3)_4$ gas was used in the same bias plasma CVD treatment in the same manner as in Example 2 to form a hard carbon protective layer containing silicon as much as 38% by atom for comparison. The results are shown in Table 1. The CSS characteristic was considerably poor.

Comparative Example 3

Methane $CH_4$ gas was made into a plasma under a gas pressure of 100 m Torr and the ions in the plasma were injected onto the same disk base in an accelerated electric field with an application of a voltage of 500 V, that is, by plasma injection CVD (PI-CVD) to form a carbon film having a thickness of 0.025 μm (the same thickness as in all of the foregoing Examples), thereby producing a magnetic disk. The results are shown in Table 1. A crush occurred with about one-half of runs of Examples 2 to 7.

TABLE 1

| Example No. | CSS test | Metal element content (% by atom) |
|---|---|---|
| 2 | No crush even after 20,000 runs | Si:7.8 |
| 3 | No crush even after 20,000 runs | Ge:7.9 |
| 4 | No crush even after 20,000 runs | Sn:7.8 |
| 5 | No crush even after 20,000 runs | Pb:7.9 |
| 6 | No crush even after 20,000 runs | Si:3.9 Ge:2.0 Sn:2.0 |
| 7 | No crush even after 20,000 runs | Ge:3.9 Sn:2.0 Pb:2.0 |
| Comp. Ex. 1 | Crush at 7,000 runs | 0 |
| Comp. Ex. 2 | " | Si:38 |
| Comp. Ex. 3 | Crush at 10,000 runs | 0 |

*CSS test: Repeated runs of a contact-start-stop test of a head and a magnetic disk.

In the foregoing Example, some of raw material carbon component gases and raw material metal element component gases are exemplified in comparison with Comparative Examples. Similar results can be obtained with other alkyl compounds and alkoxy compounds as raw material metal element components. If an alkyl compound such as $Si(CH_3)_4$ or an alkoxy compound such as $Si(OCH_3)_4$ is used as a raw material metal element component, a portion of carbon components can be introduced as a side effect from the alkyl group or the alkoxy group at the same time when the metal element is introduced.

In the foregoing Examples, a bias plasma CVD apparatus of parallel flat plate type is used. Other plasma CVD treatment apparatuses using a bias in the well known microwave ion source can also be used as a plasma generating means in the present invention.

Further embodiments of the bias plasma CVD treatment of a gas mixture consisting of a raw material carbon component gas, a raw material metal element component gas and a fluorocarbon gas according to the present invention will be shown below to improve the corrosion resistance of the hard carbon protective film.

Examples 8 to 11

Methane $CH_4$ gas, tetramethylsilane $Si(CH_3)_4$ gas and tetrafluoromethane $CF_4$ gas were mixed in ratios given in the following Table 2 and used in the same bias plasma CVD treatment under a mixed gas pressure of 10 m Torr in the same manner as in Example 2 to form fluorine and silicon-containing hard carbon protective films and the films were subjected to the CSS test and a corrosion resistance test by leaving the films at a temperature of 60° and a relative humidity of 90% for 100 hours. The silicon-containing hard carbon protective film obtained in Example 2 was also subjected to the same corrosion resistance test as above, and the results are shown in Table 2 together with the results of Examples 8 to 11.

TABLE 2

| Example No. | $CH_4$ (Parts by volume) | $Si(CH_3)_4$ (Parts by volume) | $CF_4$ (Parts by volume) | CSS test | Corrosion resistance test* |
|---|---|---|---|---|---|
| 2 | 60 | 80 | — | no crush even after 20,000 runs | 8 points/ piece |
| 8 | 55 | 8 | 5 | no crush even after 20,000 runs | 2 points/ piece |
| 9 | 50 | 8 | 10 | no crush even after 20,000 runs | 1 points/ piece |
| 10 | 40 | 8 | 20 | no crush even after 20,000 runs | 0 points/ piece |
| 11 | 30 | 8 | 30 | no crush even after 20,000 runs | 0 points/ piece |

*Increase in error points

In the foregoing Examples 8 to 11, $CF_4$ gas was used as a raw material fluorine component gas, but other fluorocarbon gases such as $CH_3F$, $CHF_3$, $C_2F_6$, $C_2H_4F_2$, $C_3F_6$, $C_3H_2F_6$, $C_4F_8$, $C_4F_{10}$, etc. can be used alone or in their mixture.

In the foregoing Examples 8 to 11, $CH_4$ gas was used as the raw material carbon component gas, but a mixture only of a raw material metal element component gas and a raw material fluorine component gas can be used without a raw material carbon component gas.

As is obvious from the foregoing results, the present magnetic disk of Examples 1 to 7 has distinguished attrition resistance, peeling resistance and crack resistance. By further adding fluorine to the hard carbon protective layer as in Examples 8 to 11, a magnetic disk can have a distinguished corrosion resistance.

In the foregoing Examples, description has been made only of a magnetic disk, but the present invention is also effective for a floppy disk, a magnetic tape and a magnetic card.

What is claimed is:

1. A process which comprises the steps of placing a base plate comprising a nonmagnetic substrate and a metallic thin film magnetic layer provided on the substrate in a high frequency plasma treatment chamber, evacuating the chamber to a high vacuum, feeding a saturated hydrocarbon compound and at least one of hydrides, alkyl compounds and alkoxy compounds of at least one metal element selected from the group consisting of silicon, germanium, tin and lead into the chamber separately or in their mixture, and conducting a bias plasma CVD treatment under a negative self bias voltage of 300 to 600 volts under a mixed gas pressure of 1 to 500 m Torr, thereby forming a hard carbon protective film having a Vickers hardness of 2,000 to 6,000 Kg/mm$^2$ containing at least one of the metal elements on the magnetic layer.

2. The process for according to claim 1 wherein a fluorocarbon is fed into the chamber prior to the bias plasma CVD treatment.

UNITED STATES PATENT AND TRADEMARK OFFICE
CERTIFICATE OF CORRECTION

PATENT NO. : 5,275,850
DATED : January 4, 1994
INVENTOR(S) : Makoto Kito, et al

It is certified that error appears in the above-indentified patent and that said Letters Patent is hereby corrected as shown below:

Column 1, line 33, before "medium" insert --the--.
Column 4, line 34, after "However," insert --too--.

Signed and Sealed this

Twelfth Day of July, 1994

Attest:

BRUCE LEHMAN

Attesting Officer

Commissioner of Patents and Trademarks